United States Patent
Wu et al.

(10) Patent No.: US 8,679,359 B2
(45) Date of Patent: Mar. 25, 2014

(54) LOW TEMPERATURE METAL ETCHING AND PATTERNING

(75) Inventors: Fangyu Wu, Atlanta, GA (US); Dennis W. Hess, Atlanta, GA (US); Galit Levitin, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 234 days.

(21) Appl. No.: 13/104,864

(22) Filed: May 10, 2011

(65) Prior Publication Data

US 2011/0275220 A1 Nov. 10, 2011

Related U.S. Application Data (60) Provisional application No. 61/332,915, filed on May 10, 2010.

(51) Int. Cl.
*H01L 21/3065* (2006.01)

(52) U.S. Cl.
USPC ............. 216/67; 216/75; 216/78; 438/710; 438/715; 438/720; 257/E21.218

(58) Field of Classification Search
None
See application file for complete search history.

(56) References Cited

U.S. PATENT DOCUMENTS

| | | | |
|---|---|---|---|
| 5,384,267 A * | 1/1995 | Hutchins et al. | 438/59 |
| 5,431,774 A * | 7/1995 | Douglas | 216/57 |
| 5,968,847 A * | 10/1999 | Ye et al. | 438/734 |
| 6,010,603 A * | 1/2000 | Ye et al. | 204/192.35 |
| 6,277,726 B1 * | 8/2001 | Kitch et al. | 438/618 |
| 6,368,517 B1 * | 4/2002 | Hwang et al. | 216/67 |
| 6,376,353 B1 * | 4/2002 | Zhou et al. | 438/612 |
| 7,528,071 B2 * | 5/2009 | Kim et al. | 438/687 |
| 7,659,197 B1 * | 2/2010 | Juliano | 438/652 |
| 7,897,516 B1 * | 3/2011 | Kinder et al. | 438/695 |
| 2006/0030151 A1 * | 2/2006 | Ding et al. | 438/687 |
| 2006/0035173 A1 | 2/2006 | Davidson et al. | |
| 2007/0190771 A1 * | 8/2007 | Bailey et al. | 438/597 |
| 2010/0051577 A1 * | 3/2010 | Rueger | 216/13 |

\* cited by examiner

*Primary Examiner* — Allan Olsen
(74) *Attorney, Agent, or Firm* — Ryan A. Schneider, Esq.; Troutman Sanders LLP (57) ABSTRACT

The present invention is directed to a method and apparatus for etching various metals that may be used in semiconductor or integrated circuit processing through the use of non-halogen gases such as hydrogen, helium, or combinations of hydrogen and helium with other gases such as argon. In one exemplary embodiment of the present invention, in a reaction chamber, a substrate having a metal interconnect layer deposited thereon is exposed to a plasma formed of non-halogen gas. The plasma generated is maintained for a certain period of time to provide for a desired or expected etching of the metal. In some embodiments, the metal interconnect layer may be copper, gold or silver.

14 Claims, 6 Drawing Sheets

LOW TEMPERATURE METAL ETCHING AND PATTERNING

CROSS REFERENCE TO RELATED APPLICATION

This application claims benefit under 35 U.S.C. §119(e) of U.S. Provisional Patent Application No. 61/332,915 filed 10 May 2010, and entitled "Low Temperature Etching and Patterning of Copper by Hydrogen, Helium and Argon-hydrogen Plasma", which is incorporated by reference as if set forth herein in its entirety.

STATEMENT REGARDING FEDERALLY SPONSORED RESEARCH

This invention was made with Government support under Agreement No. CBET-0755607, awarded by the National Science Foundation. The United States Government has certain rights in the invention.

TECHNICAL FIELD

The present invention relates generally to etching processes.

BACKGROUND

The resistivity of interconnect materials is the primary determinant of integrated circuit (IC) speed for current and future devices. Patterns are normally generated in these materials by plasma-assisted (subtractive) etching. However, due to the inability to form volatile copper (Cu) etch products during halogen-based plasma etching, damascene technology was introduced to avoid the need for Cu plasma etching. Although damascene technology played an essential role in the initial implementation of Cu metallization, a critical limitation has arisen where the electrical resistivity of Cu increases rapidly as lateral dimensions are reduced below 100 nm, approaching the electron mean free path in Cu (40 nm at 25° C.).

BRIEF SUMMARY OF THE DISCLOSURE

Briefly described, embodiments of the present invention are directed towards methods of etching a metal interconnect layers used in IC products through the use of non-halogen gas based plasma wherein the metal has not been reacted with a halogen gas such as chlorine or bromine, "a non-halogenated metal". In one embodiment of the present invention, in a reaction chamber, a substrate having a metal interconnect layer comprising a non-halogenated metal deposited thereon is exposed to a plasma formed of non-halogen gas. The plasma generated is maintained for a certain period of time to provide for a desired or expected etching of the metal. In some embodiments, the metal interconnect layer is copper but may also include other metals such as titanium, silver, and gold.

Another exemplary embodiment of the present invention is a method for etching in a reaction chamber a metal interconnect layer comprising a non-halogenated metal deposited on a substrate, the method comprising introducing a gas stream comprised of a non-halogen gas into the reaction chamber; initiating a plasma from the gas stream by energizing one or more electrodes, maintaining the plasma for a desired period of time to etch at least a portion of the metal interconnect layer, abating the gas stream and extinguishing the plasma. In some embodiments of the present invention, the substrate includes, but is not limited to, a silicon wafer or a polymeric substrate such as a printed circuit board. In further embodiments of the present invention, the non-halogen gas may include, but is not limited to, hydrogen, helium, or combinations of hydrogen or helium with other gases such as argon. An exemplary way in which the reaction chamber may create a plasma is a combination of a high voltage electrode connected to a high frequency voltage source such as a high voltage radio frequency (rf) generator and a ground (usually the reaction chamber itself).

The foregoing summarizes beneficial aspects of the present invention, but is not intended to be reflective of the full scope of the present invention as claimed. Additional features and advantages of the present invention are set forth in the following description, are apparent from the description, or learned by practicing the present invention. Moreover, the foregoing summary and following detailed description are exemplary and explanatory, and are intended to provide further explanation of the present invention as claimed.

BRIEF DESCRIPTION OF THE DRAWINGS

The accompanying drawings, which are incorporated in and constitute a part of this specification, illustrate multiple exemplary embodiments of the present invention and, together with the description, serve to explain the principles of the present invention. They are not intended in any manner to limit the scope of the present invention. Headings provided herein are for convenience only and do not necessarily affect the scope or meaning of the claimed invention.

DETAILED DESCRIPTION

The subject matter of the various embodiments is described with specificity to meet statutory requirements. However, the description itself is not intended to limit the scope of the claimed invention. Rather, it has been contemplated that the claimed invention can be embodied in other ways, to include different steps or elements similar to the ones described in this document, in conjunction with other present or future technologies. Although the term "step" can be used herein to connote different aspects of methods employed, the term should not be interpreted as implying any particular order among or between various steps herein disclosed unless and except when the order of individual steps is explicitly required. The following description is illustrative and non-limiting to any one aspect.

It should also be noted that, as used in the specification and the claims, the singular forms "a," "an" and "the" include plural references unless the context clearly dictates otherwise. For example, reference to a component is intended to also include composition of a plurality of components. References to a composition containing "a" constituent are intended to include other constituents in addition to the one named. Also, in describing preferred embodiments, terminology will be resorted to for the sake of clarity. It is intended that each term contemplates its broadest meaning as understood by those skilled in the art and includes all technical equivalents that operate in a similar manner to accomplish a similar purpose.

Ranges can be expressed herein as from "about" or "approximately" one particular value and/or to "about" or "approximately" another particular value. When such a range is expressed, other exemplary embodiments include from the one particular value and/or to the other particular value. The terms "comprising" or "containing" or "including" mean that at least the named component, element, particle, or method step is present in the system or article or method, but does not exclude the presence of other components, materials, particles, or method steps, even if the other such components, material, particles, and method steps have the same function as what is named.

It is also to be understood that the mention of one or more method steps does not preclude the presence of additional method steps or intervening method steps between those steps expressly identified. Similarly, it is also to be understood that the mention of one or more components in a system or composition does not preclude the presence of additional components than those expressly identified. To facilitate an understanding of the principles and features of the present invention, embodiments are explained hereinafter with reference to implementation in illustrative embodiments.

Initially, the transition from patterning Al to patterning Cu in semiconductor processing was unsuccessful because, unlike Al, Cu did not form volatile halogenated etch products at temperatures below 180° C. This limitation inhibited the subtractive plasma etching of Cu at temperatures compatible with organic resist materials. Even with the implementation of "hard" masks such as $SiO_2$, difficulties were encountered because considerable sputtering of the mask material occurred as a result of the combined effects of significant ion bombardment energy and elevated temperature needed to obtain adequate etch rates and anisotropic etch profiles. These restrictions led to the introduction of damascene technology in 1997. In this process, the need to subtractively pattern or etch Cu is avoided by first plasma etching trenches or vias in a dielectric layer to form the regions where Cu interconnects are to be placed. Cu films are then electroplated into the vias, followed by chemical mechanical planarization/polishing (CMP) removal of the Cu overburden that exists above the dielectric film.

Damascene technology has played an essential role in the initial implementation of Cu metallization. However, a critical limitation in this approach to Cu patterning has arisen due to the adherence of the IC industry to Moore's Law and thus the reduction of minimum feature sizes, currently (2010) at 45 nm, as described by the International Technology Roadmap for Semiconductors (ITRS). This limitation is the "size effect" of Cu, a phenomenon in which the electrical resistivity of Cu increases rapidly as lateral dimensions are reduced below 100 nm, thereby approaching the electron mean free path in Cu (40 nm at 25° C.). As a result of the resistivity increase, device and circuit speed decrease with decreasing pattern or feature size. The size effect is caused by electron scattering from both Cu sidewalls and grain boundaries. Two approaches exist to reduce or eliminate this size effect: decrease the Cu sidewall/surface roughness and grow larger Cu grains. However, grain growth of Cu in damascene technology is dramatically hindered by the narrow geometries and impurities introduced into Cu that result from CMP and plating processes; that is, grain boundaries are pinned at the sidewalls, thereby limiting grain growth and electroplating is a liquid process where solvents and additives are present to permit defect-free filling of narrow, high aspect ratio trenches. Therefore, the Cu size effect that causes degradation of current and future device speed cannot be suppressed by existing Cu patterning technology.

With the exception of Cu, plasmas are used to define patterns for the films used in IC fabrication. In comparison to damascene technology, subtractive plasma etching begins with a blanket, high purity (sputtered or evaporated instead of plated) and annealed Cu film which therefore has reasonable grain size (~1.5 times the film thickness in the sub-100 nm regime). The resistivity of the blanket, high purity, annealed Cu film should therefore increase only moderately when patterned by plasma etching. An increase in resistivity is expected due to the small line width (<100 nm) and thus surface scattering that takes place in Cu patterns with widths similar to the electron mean free path. Because plasma-based etching can be used to pattern metal (conducting) films other than Cu, this method of reducing the size effect can be evaluated.

Halogen-based (specifically chlorine-containing) plasmas have to date been the ones investigated to plasma etch Cu. In large part this has occurred because copper chlorides have the highest volatility of any halogen-containing Cu compound. Furthermore, other conducting films such as Al, W, and heavily doped polycrystalline silicon have been successfully etched by chlorine-based plasmas for many years. However, removal of Cu etch products from the surface is hindered due to the low volatility of Cu halides. High temperatures (>180° C.) have been generally invoked to enhance desorption of Cu chlorides. Alternatively, photon-enhanced removal of Cu chlorides at temperatures below 100° C. by laser, UV, or infrared radiation has been reported. Both these approaches introduce complexity and control issues into the patterning process. For example, high temperatures greatly limit the choice of mask materials and lead to etch system compatibility issues, while exposure of the etching surface to photons increases etch reactor complexity although more reasonable temperatures are apparently possible. In order to avert problems with product desorption, Cu chlorides formed by chlorine- or bromine-containing plasmas have been removed by immersion of the halogenated Cu layers in dilute HCl solutions.

Figure 1:
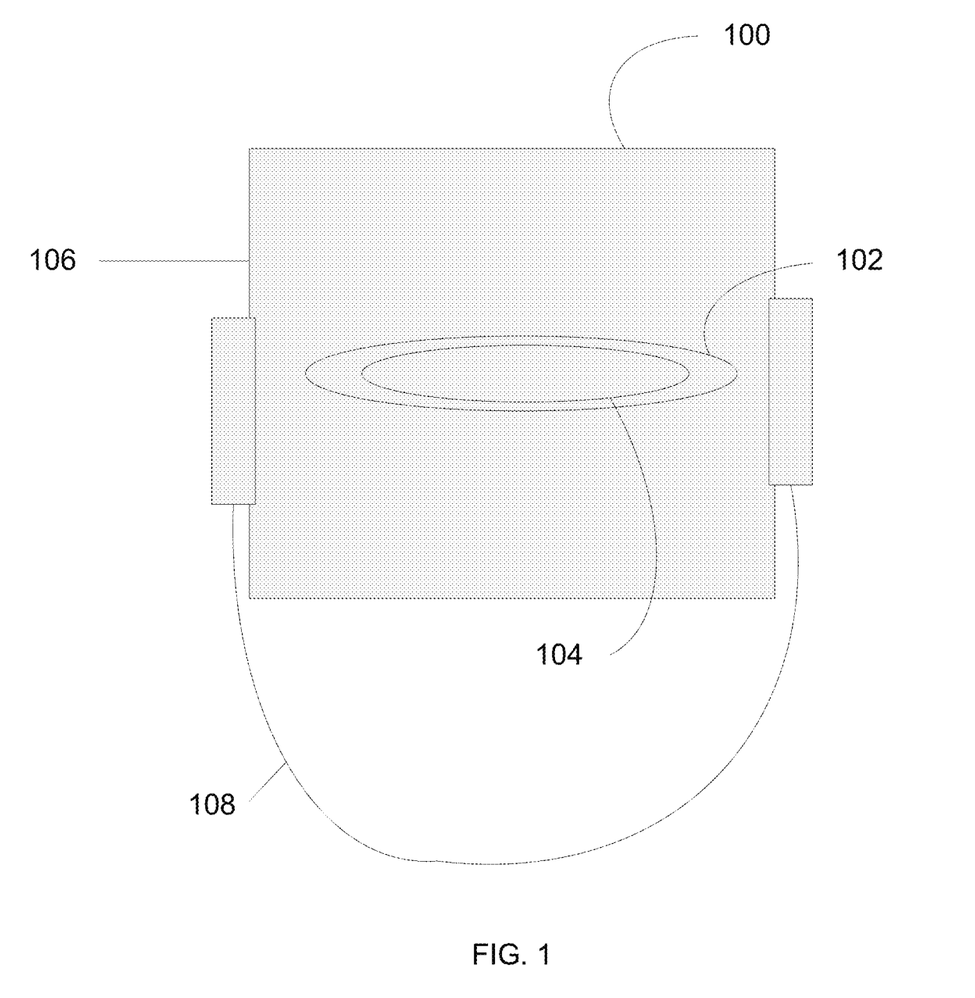
FIG. 1 is an illustration of an exemplary apparatus for etching a metal layer according to an exemplary embodiment of the present invention.

The present invention provides a relatively low-temperature alternative than described above. Metal interconnect layers comprised of non-halogenated metals may be etched using non-halogen gas based plasmas at relatively low temperatures when compared to the chlorination etch processes described above. FIG. 1 illustrates an exemplary apparatus for performing various embodiments of the present invention. Reaction chamber 100 has disposed within its chamber volume silicon wafer 102. Reaction chamber 100 can be of various configurations or may be part of another processing machine. For example, reaction chamber 100 can have both deposition and etch capabilities. In another example, reaction chamber 100 can be a separate etch machine. Further, the present invention is not limited to processing on silicon substrates, such as silicon wafer 102. For example, various embodiments of the present invention can be used on other processes similar to semiconductor processing such as, but not limited to, IC processing on polymeric, carbon-based, printed circuit board, or other types of substrates.

Silicon wafer 102 has deposited thereon a non-halogenated copper layer 104. Copper layer 104 can be deposited in reaction chamber 100 or another processing machine, such as a dedicated Cu deposition machine. The present invention is not limited to the use of non-halogen gas based plasmas to etch copper; rather, the scope of the present invention includes, but is not limited to, other metals such as gold and silver. Additionally, the present invention is not limited to the etching of interconnect metal layers but can be used to etch other metal components such as vias or pads.

Copper layer 104 is deposited onto an intermediate layer, such as titanium, to provide for adhesion of copper layer 104 to silicon wafer 102. A mask, such as $SiO_2$ (not shown), can be used to provide a means for pattern generation in the Cu layer, where the mask protects certain regions of the copper layer 104 from etching. It should be noted that the mask is not limited to $SiO_2$ but may also include, but is not limited to, $SiN_x$ or other types of hard masks. To etch copper layer 104 according to various embodiments of the present invention, a non-halogen gas is introduced into reaction chamber 100 through gas inlet 106. The present invention is described as using hydrogen, helium or combinations of the two with other gases such as argon, though it should be understood that other gases or gas combinations having similar molecular properties as the previously listed gases are considered to be within the scope of the present invention.

After the non-halogen gas is introduced into reaction chamber 100 via gas inlet 106, a plasma is ignited within reaction chamber 100. To facilitate the generation of the plasma, reaction chamber 100 has electrodes 108 powered by a high frequency, high voltage power source which, in combination with the grounding of reaction chamber 100, provide for a potential across reaction chamber 100. Electrodes 108 can be comprised of at least one high potential electrode and at least one low potential electrode. In typical applications, the low potential electrode is the chamber walls of the reaction chamber 100, as the chamber is typically grounded. The potential causes the excitation of the hydrogen gas introduced through gas inlet 106. In some examples, reaction chamber 100 can also be configured with a rotating magnetic source that causes the plasma to rotate and to be centralized over silicon wafer 102, thereby enhancing the etching effect. The plasma is maintained for a desired period of time, interacting with copper layer 104 to etch at least a portion of copper layer 104.

Experiment I

Figures 2A, 2B, 2C, 2D, 2E:
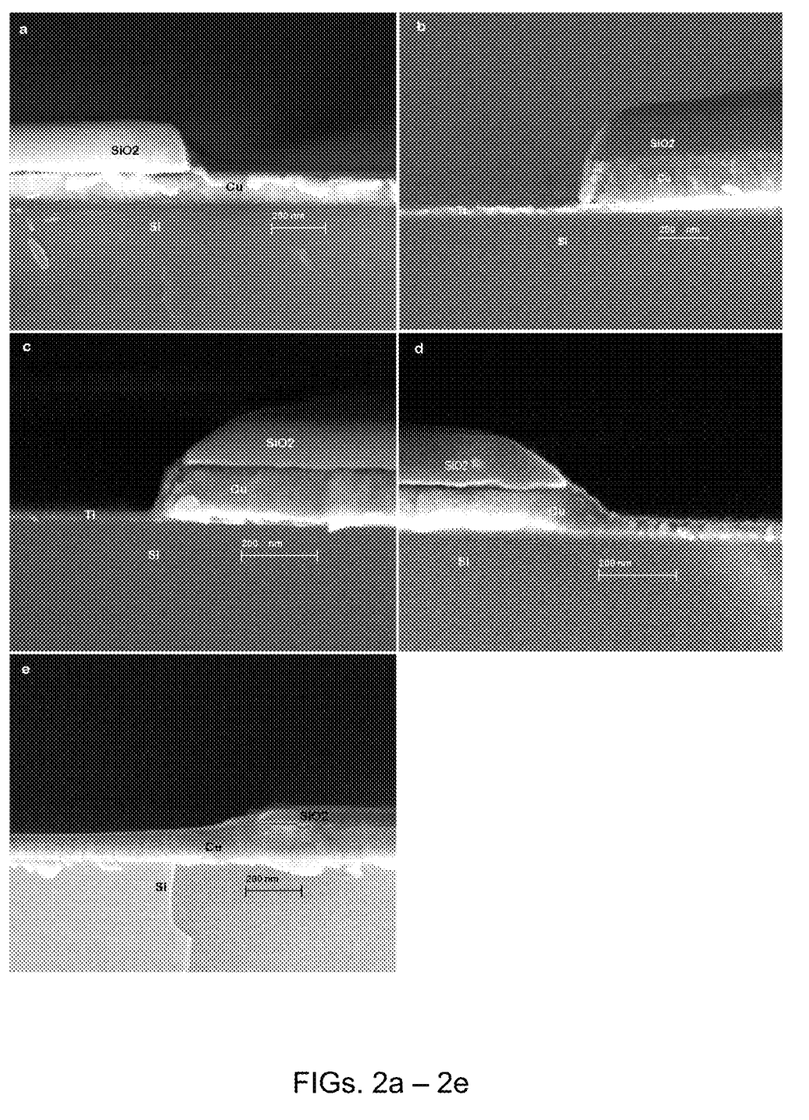
FIGS. 2a-2e are scanning electron microscope (SEM) images after processing according to an exemplary embodiment of the present invention.

Plasma etching of 100 nm Cu films was performed in an inductively coupled plasma (ICP) reactor. FIG. 2a shows a scanning electron microscope (SEM) image of an $SiO_2$-masked Cu film prior to etching; FIG. 2b indicates that an 8 min $H_2$ plasma completely removed a 100 nm copper film (above a 20 nm Ti adhesion layer) under the conditions RF1 (platen power)=100 W, RF2 (coil power)=500 W, with flow rate and pressure 50 sccm and 20 mtorr, respectively. The temperature of the substrate electrode was assumed to be the same as that of the chiller (10° C.). Although this may not be the Cu surface temperature, substantial temperature excursions (>20° C.) are unlikely over the etch time and conditions used. FIG. 2b shows that etching terminated at the Ti adhesion layer, indicating that etch selectivity of Cu over Ti is possible. In addition, the Cu profile is anisotropic, although the sidewall surface is rough. This result demonstrates the feasibility of etching Cu with a pure $H_2$ plasma at low temperatures.

Figure 3A:
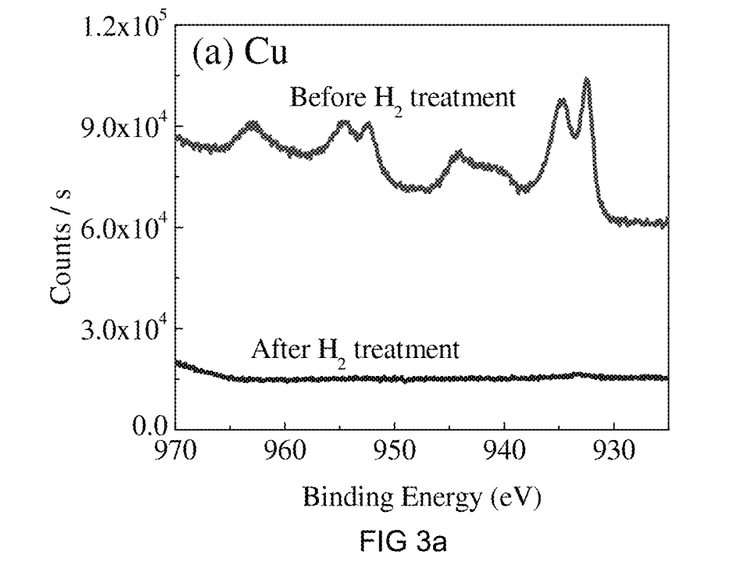
FIGS. 3a and 3b are X-ray photoelectron spectroscopy taken from etched samples according to an exemplary embodiment of the present invention.
Figure 3B:
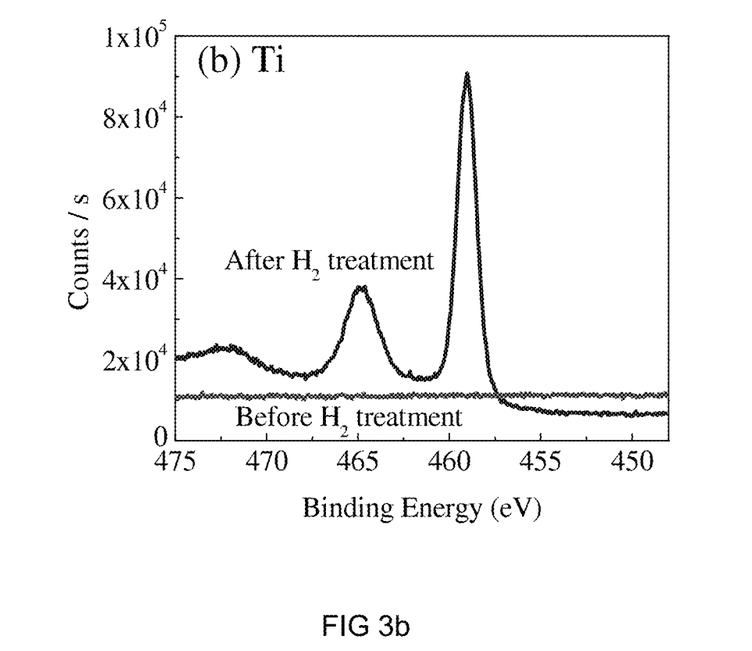

Further etch studies on blanket Cu samples were performed. X-ray photoelectron spectroscopy (XPS) was used to probe blanket Cu surfaces before and after an 8 min $H_2$ etch cycle. FIG. 3a shows that the untreated sample displays four characteristic peaks for Cu. Ti is not detected (FIG. 3b) since the sampling depth of XPS is <10 nm. The lower portion of FIG. 3a shows the peaks after the $H_2$ plasma treatment. Cu peaks are not apparent which indicates removal of the Cu film by the $H_2$ plasma at least to the detectability limit of XPS. The appearance of Ti peaks after the etch process (FIG. 3b) indicates that a $H_2$ plasma does not substantially etch Ti under these etch conditions. FIGS. 2c and 2e are cross-sectional images of a 100 nm Cu film etched for 8 min in a 1:1 $H_2$:Ar plasma and in an Ar plasma, respectively. Both etch runs were performed with RF1=100 W, RF2=500 W, 20 mtorr pressure, and an electrode chiller temperature of 10° C. The gas flows were: 50 sccm Ar for Ar plasma, 25 sccm $H_2$ plus 25 sccm Ar for $H_2$/Ar plasma. FIG. 2e demonstrates that under these conditions, Ar is able to etch Cu, albeit at a low rate of <4 nm/min. This represents a pure sputter rate for Cu. However, ablation of the $SiO_2$ mask is shown, consistent with the ability of Ar ion bombardment to remove materials by momentum transfer. However, the $H_2$/Ar plasma (FIG. 2c) displays an improved etch result compared to Ar (FIG. 2e) and an improvement relative to that of a pure $H_2$ plasma (FIG. 2b), with a smoother etched surface and higher etch rate (~16 nm/min under the conditions used). Without being held to any specific theory of operation, it is believed that these results indicate that the mechanism involved in the $H_2$ plasma etching of Cu has a chemical component. The fact that directional etching with no discernible undercutting of the $SiO_2$ mask is observed in a $H_2$ plasma suggests that a physical (sputtering) component due to ion bombardment is also involved.

Because Ar ion bombardment should assist in the removal of Cu etch products due to the high atomic weight and thus momentum transfer, the effect of different $H_2$/Ar plasma mixtures was investigated. FIGS. 2b-2e show cross sectional SEM images of masked Cu samples after 8 min of etching using different $H_2$: Ar ratios. The etch profile anisotropy degrades with increasing Ar concentration. Also, the etch rate of Cu relative to $SiO_2$ increases and then decreases as the Ar concentration increases. Specifically, the etch rates for these different ratios were 13, 16, 10 and 4 nm/min respectively, which indicates that an optimum combination of chemical and physical effects exists for efficient Cu etching. Enhanced ion bombardment assists desorption, but the presence of hydrogen, probably H, can be important to effective etching. Finally, the increased sidewall slope that results from increasing Ar concentration (FIGS. 2b-2e) is consistent with increased sputter rate of the $SiO_2$ mask which yields sloped sidewalls.

Preliminary effects of temperature changes were also investigated by increasing the substrate temperature from 10° C. to 40° C. in 15° C. increments. $H_2$ plasma etch conditions were substantially or the same as those of previous etch studies, although 300 nm thick Cu samples were used to allow etch depths to be measured by profilometry and thereby obtain etch rates. Over this small temperature regime, etch rates were not affected by temperature. Etch rates for all experiments were ~13 nm/min. Without being held to any specific theory of operation, it is believed that hydrogen, especially in the atomic form, has a high chemical reactivity and lattice mobility. H embrittlement of Cu is an important source of Cu degradation. In a plasma environment, $H^+$ or $H^-$ can react with film material and release H into the solid, which can cause the formation of defects or highly metastable phases. Introduction of hydrogen into face centered cubic (f.c.c) metals has resulted in microstructure changes; specifically with copper, micro bubbles can be generated. These observations suggest that Cu hydrides can form as a result of plasma exposure. However, thermodynamic calculations indicate that the vapor pressures of Cu hydrides (CuH, $CuH_2$ or other $CuH_x$ species) are too low to substantially enhance vapor phase Cu removal or etching. Because it was observed that the Cu etch rate in a pure $H_2$ plasma was higher than that for the two-step etch process (chlorination followed by hydrogen treatment), alternate mechanisms for Cu etch product desorption may be occurring.

In a $H_2$ plasma, the Cu surface is bombarded by ions and electrons, as well as UV and visible photons. Without being held to any specific theory of operation, it is believed that these particles and photons supply energy to the Cu surface and can enhance etch product removal. Photodesorption of metal atoms have been reported upon exposure of alkali metals such as Na, K, and Cs to photons. Specifically, desorption of sodium atoms was detected even with 40 mW/cm$^2$ cw laser exposure, where the excitation wavelength was 514 nm. As indicated by the atomic spectrum of hydrogen, intense atomic lines in the UV wavelength range of 90-120 nm will be present in the $H_2$ plasma. Although CuH is reported to be thermally unstable, even at 0° C., more recent studies suggest that in the presence of a high hydrogen pressure or high hydrogen activity, CuH might be formed. It is also likely that this reaction can be promoted by the presence of H (e.g., from the plasma atmosphere) which can react with Cu. If sufficient stability of CuH is achieved, desorption of this product can be enhanced by ion and/or photon bombardment. Therefore, photon-assisted desorption of products such as CuH can be important in Cu removal using $H_2$ plasmas.

Experiment II

Copper films of 100 or 300 nm thickness were deposited by e-beam evaporation (CVC E-Beam Evaporator) onto silicon wafers that had been coated with 20 nm of titanium to promote Cu adhesion to silicon. Electroplated Cu films (145 nm electroplated Cu films grown from an 80 nm physical vapor deposited (PVD) seed layer followed by annealing at 200° C. in forming gas for 30 sec) were also created. Cu-coated substrates were sectioned into etch samples ~1 cm$^2$. Plasma etching of thin Cu films was performed in an inductively coupled plasma (ICP) reactor (Plasma Therm ICP). The substrate temperature was maintained at ~10° C. using a water cooled chiller connected to the substrate electrode. The $H_2$ gas flow rate was 50 standard cubic centimeters per minute (sccm) and the reactor pressure was maintained at 20 mtorr. The radio frequency power applied to the ICP coil (RF2) was 500 W, whereas the power applied to the substrate (RF1) was 100 W. Both blanket and masked Cu films were investigated in these plasma etch atmospheres. Masked Cu films invoked $SiO_2$ (~150 nm) as the mask layer. The $SiO_2$ film was deposited in a Plasma Therm PECVD (plasma enhanced chemical vapor deposition) system with 400 sccm $SiH_4$ and 900 sccm $N_2O$ as precursors; the substrate electrode was heated to 250° C., the power applied to the electrode was 25 W, and the pressure was maintained at 900 mtorr during the deposition process. Mask patterns were generated by fluorine-based plasma etching within the same ICP reactor: the etch gas was a mixture of 25 sccm Ar, 2 sccm $O_2$, 14 sccm $CF_4$ and 6 sccm $C_4F_6$, RF1 was 200 W and RF2 was 100 W, while the process pressure was maintained at 5 mtorr. Chemical analysis of the films and surfaces before and after plasma etching was performed using X-ray photoelectron spectroscopy (XPS). XPS spectra were collected using a Thermo Scientific K-Alpha XPS. Cu film patterns were examined with a scanning electron microscope (SEM, Zeiss SEM Ultra60). Thickness changes of the Cu layer were determined from SEM images and a Wyko Profilometer.

Figure 4A:
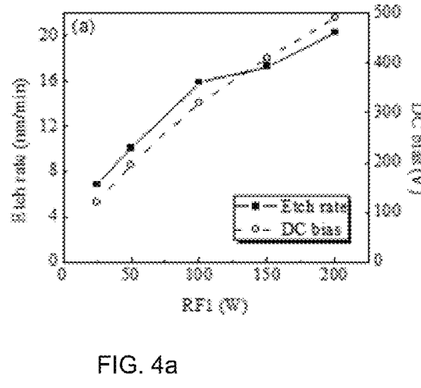
FIGS. 4a and 4b illustrate Cu etch rate and the corresponding DC bias of $H_2$ plasmas under different platen power and coil power according to an exemplary embodiment of the present invention.
Figure 4B:
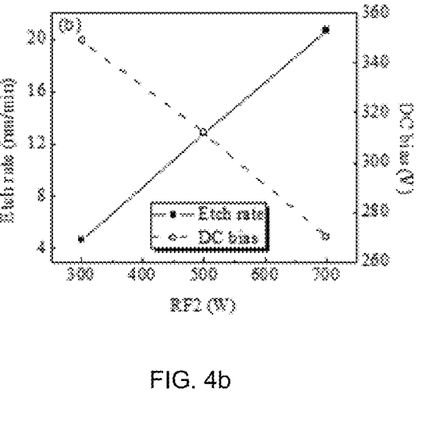

As discussed previously, the reaction chamber is configured with means to produce plasma. The selection of the means to produce the plasma depends on the type of plasma used. In typical semiconductors, the plasma produced is a non-equilibrium or non-thermal plasma. These types of plasmas, which can be used to describe a single plasma, are used to prevent spot heating of reaction products. An examples of a thermal plasma can be a lightning strike or an arc from an arc welder. In one embodiment of the present invention, a reaction chamber has two power supplies, one for coil power (for plasma generation), and the other for platen power (to accelerate ions). Both ion bombardment and photon impingement will likely be influenced by power from these two rf sources. Therefore the Cu etch rate and the corresponding DC bias of $H_2$ plasmas under different platen power (RF1, FIG. 4a) and coil power (RF2, FIG. 4b) were investigated. When changing the platen power, coil power was kept constant (500 W); likewise, when changing the coil power, the platen power was kept constant (100 W). As shown in FIG. 4a, Cu etch rates were nearly linear with platen power up to 100 W, with smaller increases at higher applied powers. This trend essentially followed changes in DC bias, which indicates the importance of ion energy in this Cu etch process. FIG. 4b demonstrates that an increase in coil (plasma) power resulted in an increase in Cu etch rate, apparently due to an increase in the flux of plasma moieties such as ions, neutral species and photons to the Cu surface, and a reduction in DC bias as expected at a constant plasma power. This trend is beneficial with respect to lowered mask ablation and mitigation of possible plasma damage from the etch process. Indeed, higher ion energy increased $SiO_2$ mask ablation and thus degraded the etch profile anisotropy.

Figure 5A:
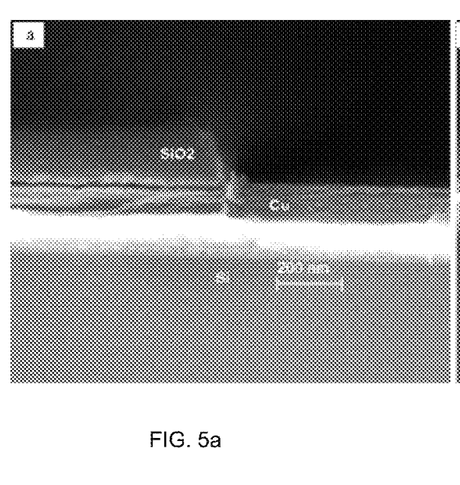
FIGS. 5a and 5b show the Cu (~180 nm) edge profile before and after a 8 min $H_2$ plasma when RF2=700 W according to an exemplary embodiment of the present invention.
Figure 5B:
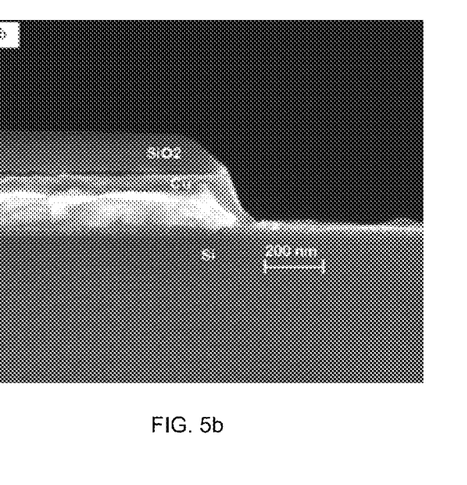

FIGS. 5a and 5b show the Cu (~180 nm) edge profile before and after a 8 min $H_2$ plasma when RF2=700 W. Higher coil power yields higher etch rate (~20 nm/min) but no obvious enhancement of $SiO_2$ mask ablation was observed for higher coil power (RF2). Such results are consistent with an increased ion flux for the process with higher plasma generation power. These observations further confirm that ion bombardment flux is an important component in the low temperature Cu etch process.

Figure 6:
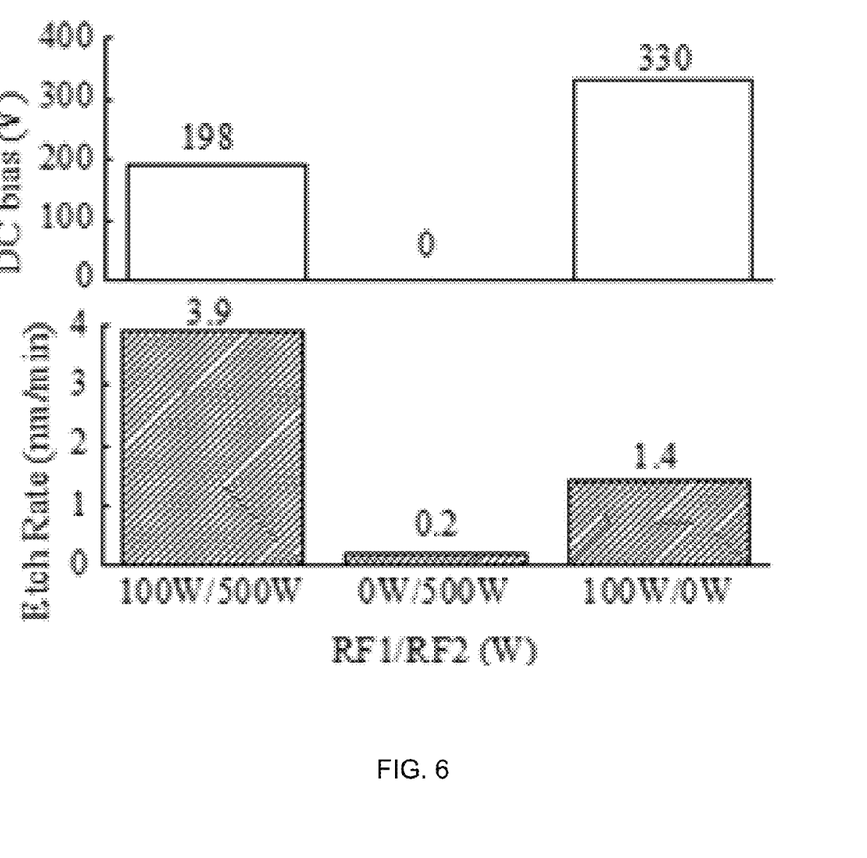
FIG. 6 shows etch rates and the corresponding DC bias under various power settings according to an exemplary embodiment of the present invention.

Preliminary studies at zero platen power and zero coil power (with the other power supply kept constant) were performed. Because of the inability to strike a plasma without platen power in the Plasma Therm ICP reactor, these experiments were performed in an STS SOE ICP reactor. These initial studies used the same pressure as well as platen and coil powers as those used in the Plasma Therm reactor. Due to the different reactor configuration/size, and the inability to cool the platen to 10° C., the Cu etch rates obtained were different. That is, for this preliminary investigation, reactor power conditions were not adjusted to obtain identical etch rates in the two reactors. FIG. 6 shows etch rates and the corresponding DC bias under the indicated power settings. Application of power to both the coil and platen yields the highest etch rate. With zero platen power (RF1=0 W) but the same coil power (RF2=500 W), the Cu etch rate is near zero, while with zero coil power (RF2=0 W) but the same platen power (RF1=100 W), the Cu etch rate is ~36% of the etch rate when power is supplied to both coil and platen. These results indicate that ion bombardment is critical to Cu etching in $H_2$ plasmas, but that ion bombardment and chemical reaction are both contributors to the etch rates achieved.

The presently disclosed embodiments are considered in all respects to be illustrative and not restrictive. The scope of the invention is indicated by the appended claims, rather than the foregoing description, and all changes that come within the meaning and range of equivalents thereof are intended to be embraced therein.

What is claimed is:

1. A method of etching a metal layer disposed on a substrate in a reaction chamber, the method comprising:
    introducing a non-halogen gas stream into the reaction chamber, the non-halogen gas comprising hydrogen;
    igniting a non-halogen gas based plasma within the reaction chamber;
    maintaining the plasma for a period of time to remove at least a portion of the metal layer, wherein the metal layer comprises a non-halogenated metal;
    extinguishing the plasma; and
    maintaining the substrate temperature at or below 40° C.;
    wherein the at least a portion of the metal layer is removed at least in part by chemical etching.

2. The method of claim 1, wherein the non-halogenated metal is selected from the group consisting of copper, silver, and gold.

3. The method of claim 1, wherein the non-halogen gas further comprises at least one of helium and argon.

4. The method of claim 1 further comprising maintaining the substrate temperature at or below 15° C.

5. The method of claim 1, wherein igniting the non-halogen gas based plasma comprises energizing a high frequency voltage potential across the reaction chamber.

6. The method of claim 1 further comprising maintaining the substrate temperature at or below 10° C.

7. A method of etching an etchable metal layer comprising:
    disposing in a reaction chamber a substrate having an etchable metal layer comprising a non-halogenated metal;
    etching at least a portion of the metal layer with a non-halogen gas based plasma, the non-halogen gas comprising hydrogen; and
    maintaining the substrate temperature at or below 40° C.;
    wherein the at least a portion of the metal layer is removed at least in part by chemical etching.

8. The method of claim 7 further comprising maintaining the substrate temperature at or below 15° C.

9. The method of claim 7 further comprising maintaining the substrate temperature at or below 10° C. during the etching.

10. The method of claim 7, wherein the non-halogen gas based plasma is formed by igniting a non-halogen gas in the reaction chamber.

11. The method of claim 10, wherein the non-halogen gas further comprises at least one of helium and argon.

12. The method of claim 7 further comprising extinguishing the plasma.

13. The method of claim 7, wherein the substrate having an etchable layer comprises a silicon wafer with a non-halogenated metal layer selected from the group consisting of copper, silver, and gold.

14. The method of claim 7, wherein the substrate having an etchable layer comprises a polymeric substrate with a non-halogenated metal layer selected from the group consisting of copper, silver, and gold.

* * * * *